(12) United States Patent
Yang et al.

(10) Patent No.: US 9,281,443 B2
(45) Date of Patent: Mar. 8, 2016

(54) LIGHT-EMITTING DIODE ARRAY

(71) Applicant: Epistar Corporation, Hsinchu, R.O.C. (TW)

(72) Inventors: Tsung-Hsien Yang, Hsinchu (TW); Han-Min Wu, Hsinchu (TW); Jhih-Sian Wang, Hsinchu (TW); Yi-Ming Chen, Hsinchu (TW); Tzu-Ghieh Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 13/959,891

(22) Filed: Aug. 6, 2013

(65) Prior Publication Data

US 2014/0034977 A1 Feb. 6, 2014

(30) Foreign Application Priority Data

Aug. 6, 2012 (TW) .............................. 101128394 A

(51) Int. Cl.
| | |
|---|---|
| *H01L 29/207* | (2006.01) |
| *H01L 21/00* | (2006.01) |
| *H01L 33/08* | (2010.01) |
| *H01L 27/15* | (2006.01) |
| H01L 33/00 | (2010.01) |
| H01L 33/22 | (2010.01) |
| H01L 33/38 | (2010.01) |

(52) U.S. Cl.
CPC .............. *H01L 33/08* (2013.01); *H01L 27/156* (2013.01); *H01L 33/0079* (2013.01); *H01L 33/22* (2013.01); *H01L 33/385* (2013.01); *H01L 2224/48091* (2013.01); *H01L 2224/48247* (2013.01)

(58) Field of Classification Search
CPC ... H01L 27/30; H01L 27/3239; H01L 31/143; H01L 31/162; H01L 33/08; H01L 33/18; H01L 33/24; H01L 51/5032; H01L 25/048; H01L 27/288; H01L 27/32
USPC ........ 257/13, 79–103, 918, 40, 642–643, 759
See application file for complete search history.

(56) References Cited

U.S. PATENT DOCUMENTS

| | | | |
|---|---|---|---|
| 2009/0029492 A1* | 1/2009 | Tu ........................... | H01L 33/22 438/22 |
| 2011/0089444 A1* | 4/2011 | Yao et al. ......................... | 257/93 |
| 2011/0101400 A1* | 5/2011 | Chu et al. ......................... | 257/98 |
| 2011/0215350 A1* | 9/2011 | Song et al. ....................... | 257/93 |
| 2012/0034714 A1* | 2/2012 | Tsai et al. ........................ | 438/16 |

* cited by examiner

*Primary Examiner* — Robert Bachner
*Assistant Examiner* — Moin Rahman
(74) *Attorney, Agent, or Firm* — Ditthavong & Steiner, P.C.

(57) ABSTRACT

The application provides a light-emitting diode array, including: a first light-emitting diode including a first area; a second area; a first isolation path between the first area and the second area, and the first isolation path including an electrode isolation layer; and an electrode contact layer covering the first area; a second light-emitting diode including a semiconductor stack layer; and a second electrical bonding pad on the semiconductor stack layer; and a second isolation path between the first light-emitting diode and the second light-emitting diode, wherein the second isolation path includes an electrical connecting structure electrically connected to the first light-emitting diode and the second light-emitting diode.

17 Claims, 12 Drawing Sheets

LIGHT-EMITTING DIODE ARRAY

RELATED APPLICATIONS

The present application claims the right of priority based on Taiwan Patent Application No. 101128394 entitled "LIGHT-EMITTING DIODE ARRAY", filed on Aug. 6, 2012, and is incorporated herein by reference in its entirety and assigned to the assignee herein.

TECHNICAL FIELD

The present application generally relates to a light-emitting device and a manufacturing method of the same, and more particularly to a light-emitting diode having an electrode insulation layer structure and a manufacturing method of the same to alleviate the current leakage problems.

BACKGROUND

Light-emitting diodes (LEDs) semiconductor devices that are widely used as light sources. Compared to conventional incandescent light lamps or fluorescent light tubes, light-emitting diodes have lower power consumption and longer lifetime, hence they gradually replace the conventional light sources and are applied to various fields such as traffic lights, back light modules, street lighting, and medical equipment.

As the demand for the brightness of light-emitting diodes is getting higher as the applications and developments evolve, it is a common goal for LED industry to make efforts to increase luminescence efficiency and brightness.

FIG. 14 shows a conventional LED package 300 of a semiconductor lighting device comprising the semiconductor LED chip 2 encapsulated in the encapsulation 1, wherein the semiconductor LED chip 2 comprises a p-n junction 3, and the encapsulation 1 is usually made of thermosetting material, such as epoxy, or thermoplastic material. The semiconductor LED chip 2 is connected to two conductive frames 5, 6 by a wire 4. The epoxy-encapsulated LED can only work in a low temperature environment since degradation of epoxy can occur at high temperature. Besides, epoxy has high thermal resistance, providing the semiconductor LED chip 2, as shown in FIG. 14, a high resistance to heat dissipation, thus limiting the conventional LED package 300 to work at low power level.

SUMMARY

In one embodiment of the present application, a light-emitting diode array, comprising: a first light-emitting diode comprising a first area; a second area; a first isolation path between the first area and the second area, wherein the first isolation path comprises an electrode isolation layer; and an electrode contact layer covering the first area; a second light-emitting diode comprising a semiconductor stack layer; and a second electrical bonding pad on the semiconductor stack layer; and a second isolation path between the first light-emitting diode and the second light-emitting diode, wherein the second isolation path comprises an electrical connecting structure electrically connected to the first light-emitting diode and the second light-emitting diode.

In another embodiment of the present application, a light-emitting diode array, comprising: a substrate having a first surface; a plurality of light-emitting diodes on the first surface; a plurality of conductive lines on the first surface and electrically connected to the plurality of light-emitting diodes; two electrical bonding pads on the first surface; and an isolation path between one of the electrical bonding pads and one of the light-emitting diodes, wherein a distance between the electrical bonding pad and the light-emitting diode that are proximal to the isolation path is not less than 25 μm.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
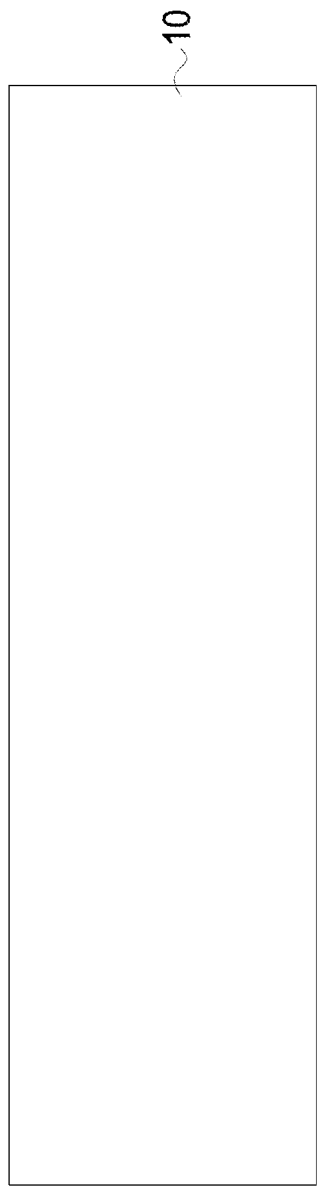
FIGS. 1-12 illustrate a cross-sectional view of a light-emitting diode array during a manufacturing process in accordance with the first embodiment of the present application.
Figure 2:
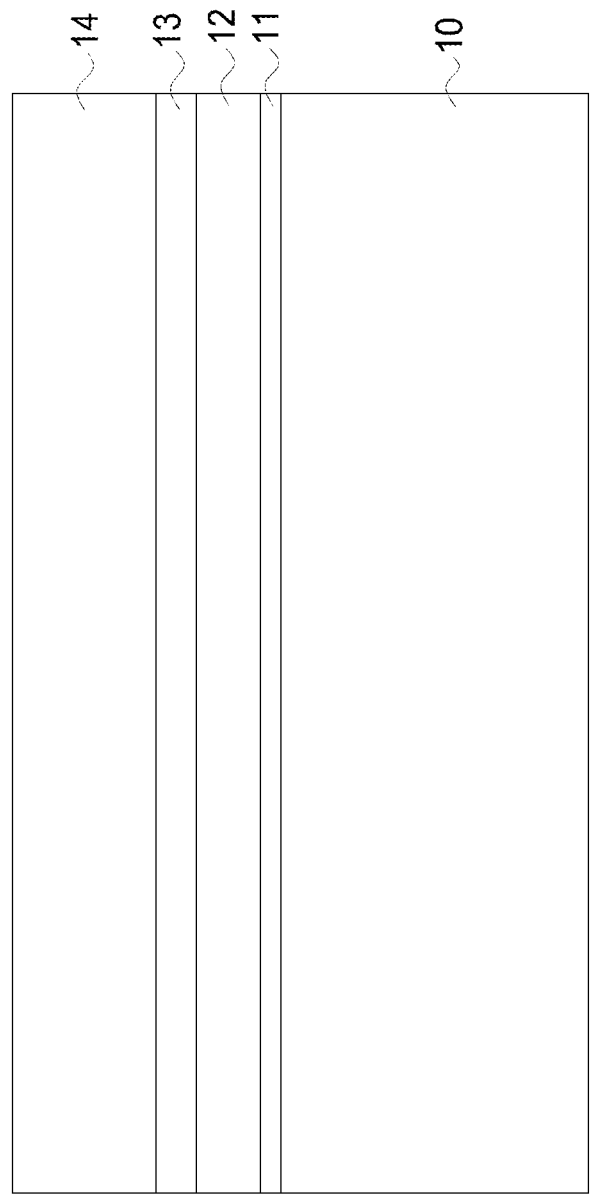

The first embodiment of the present application is illustrated in FIG. 1 to FIG. 12. The structure and manufacturing process of the light-emitting diode array 1000 in accordance with the first embodiment of the present application are as follows. Referring to FIG. 1, a growth substrate 10 such as GaAs substrate is provided, and a plurality of light-emitting diodes 100, 200 are directly grown on the substrate by epitaxy, as shown in FIGS. 2 to 12. The number of the light-emitting diodes of the present embodiment is, but not limited to, two. Each of the light-emitting diodes comprises a first conductive type contact layer 11, a first conductive type semiconductor layer 12, an active layer 13, and a second conductive type semiconductor layer 14, as shown in FIG. 2. The first conductive type contact layer 11 can be n-type GaAs. The material of the first conductive type semiconductor layer 12, the active layer 13, and the second conductive type semiconductor layer 14 comprises one or more elements selected from the group consisting of Ga, Al, In, As, P, N, Si, and the combination thereof. For example, the material comprises GaP or AlGaInP.

Figure 3:
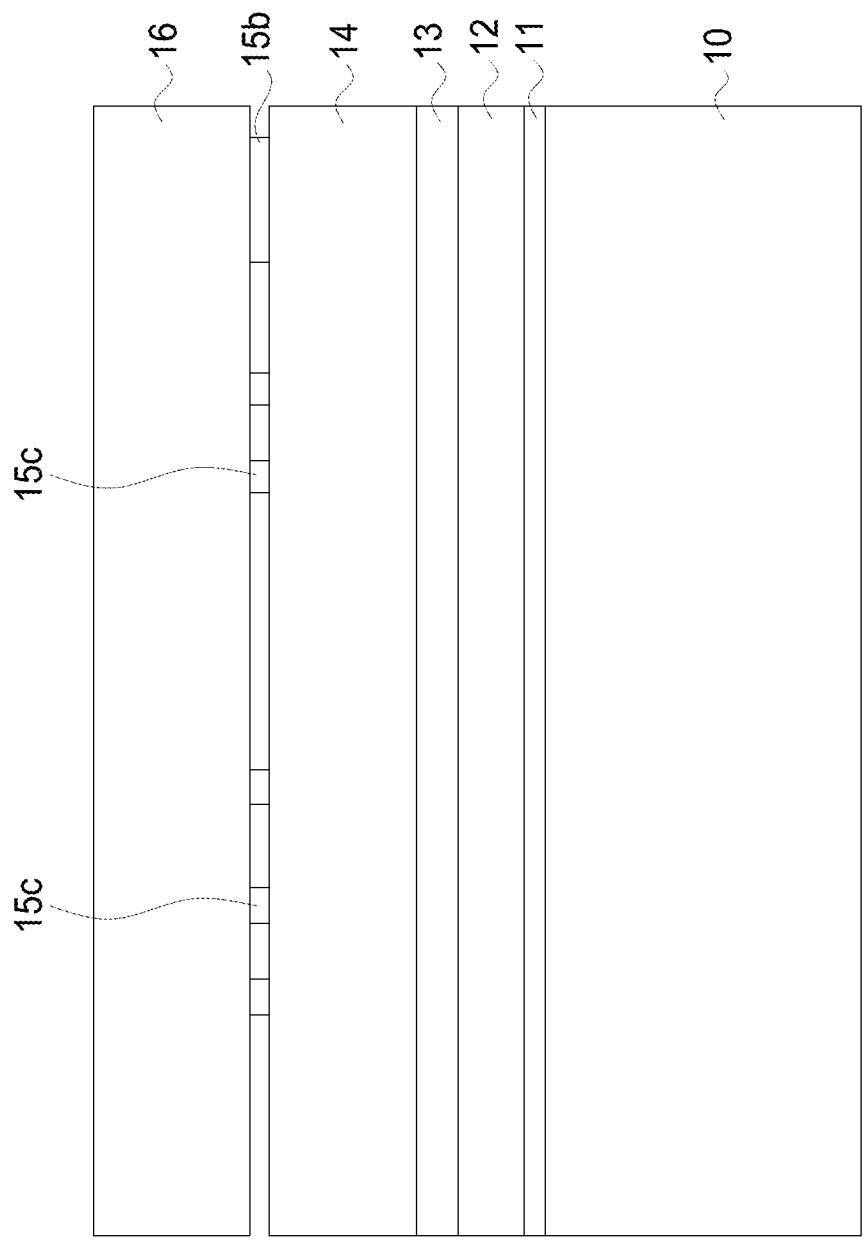
Figure 4:
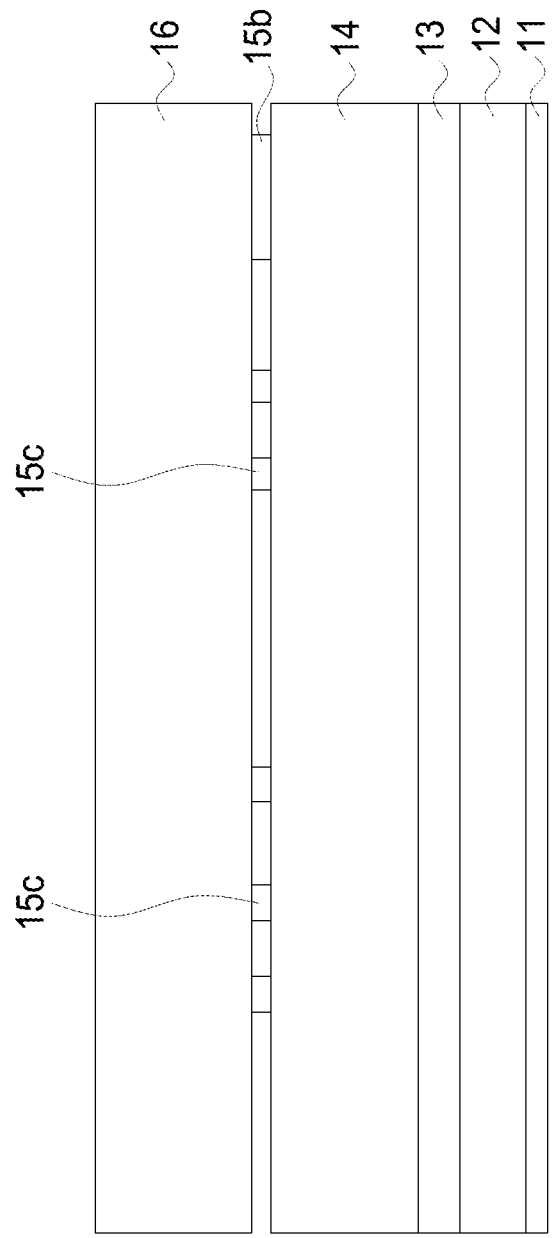
Figure 5:
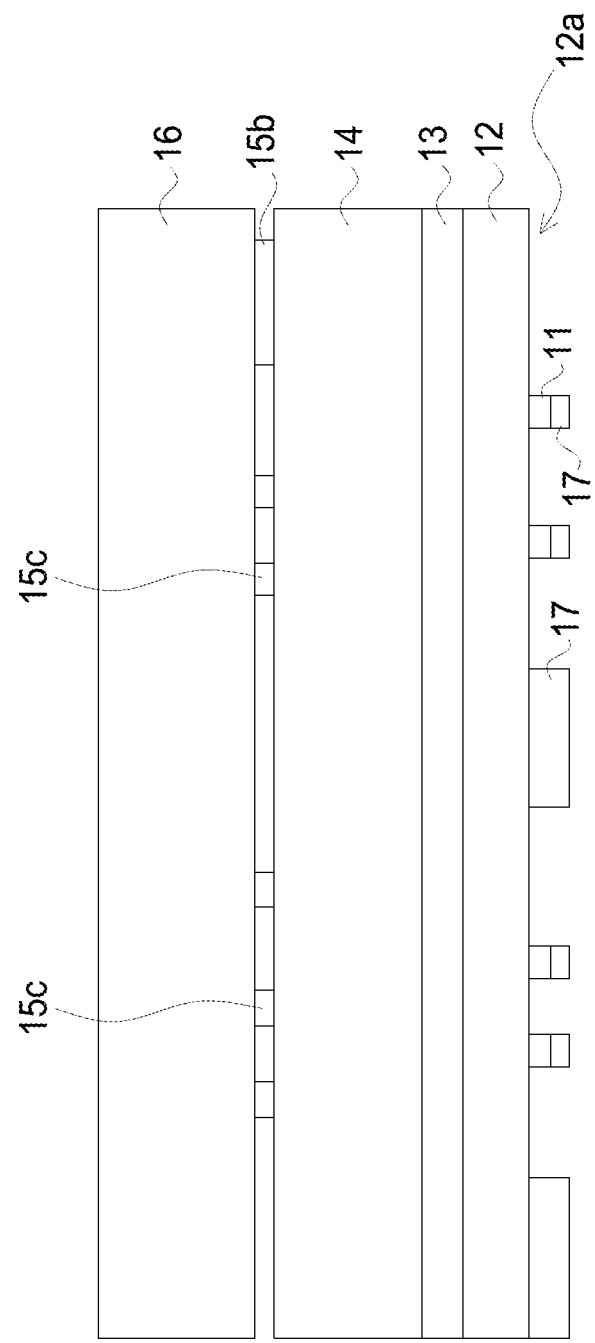

An electrode structure is formed on a selected region of the second conductive type semiconductor layer 14 by evaporation. The electrode structure comprises one second electrical electrode 15b and a plurality of second electrical extension electrodes 15c. Referring to FIGS. 3 to 4, a temporary substrate 16 is formed on these electrodes, and then the growth substrate 10 is removed, wherein the temporary substrate 16 can be glass. A plurality of dot structures are formed by removing partial of the first conductive type contact layer 11 through lithography and etching process, and a lower surface 12a of the first conductive type semiconductor layer 12 is exposed. An electrical contact layer 17 is formed under the partial lower surface 12a and the plurality of dot structures of the first conductive type contact layer 11, as shown in FIG. 5. A material of the above mentioned second electrical electrode 15b and the plurality of second electrical extension electrodes 15c can be metal materials, such as Cr, Ti, Ni, Pt, Cu, Au, Al, W, Sn or Ag. A material of the electrical contact layer 17 can be Ge/Au.

Figure 6:
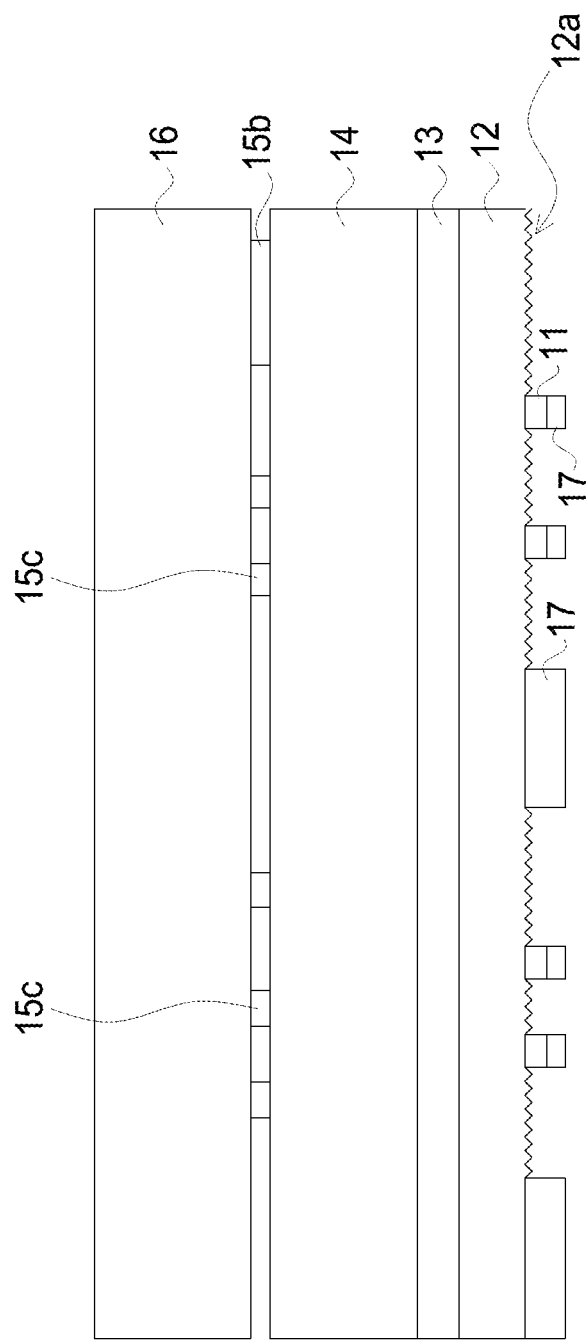
Figure 7:
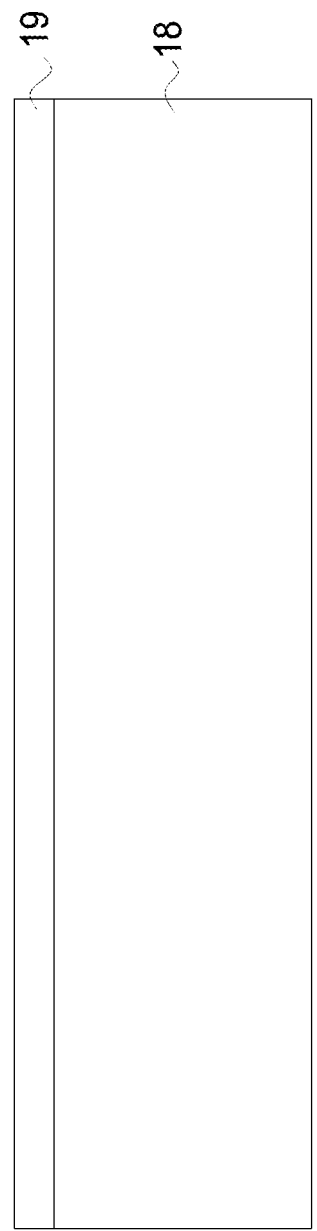
Figure 8:
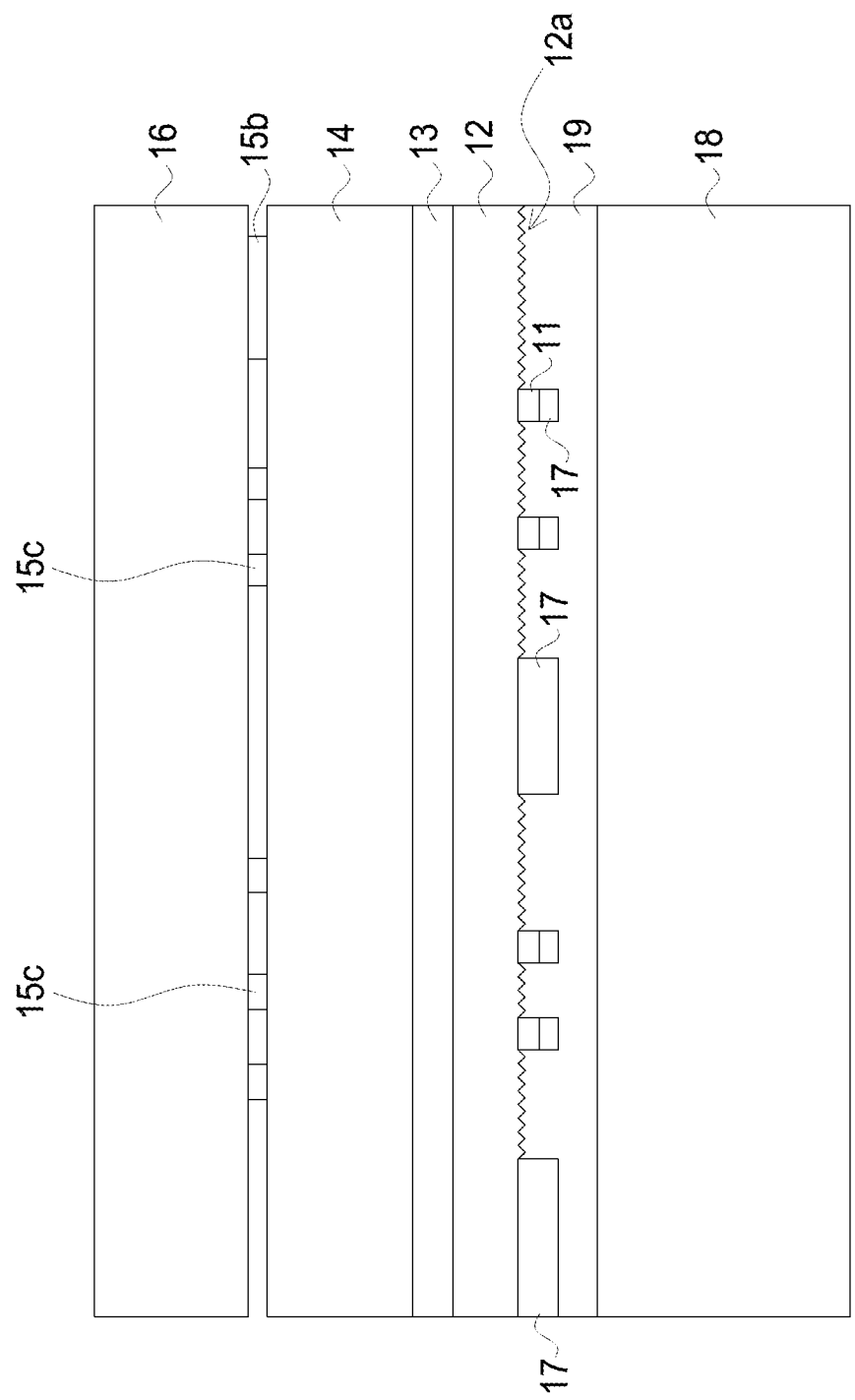
Figure 9:
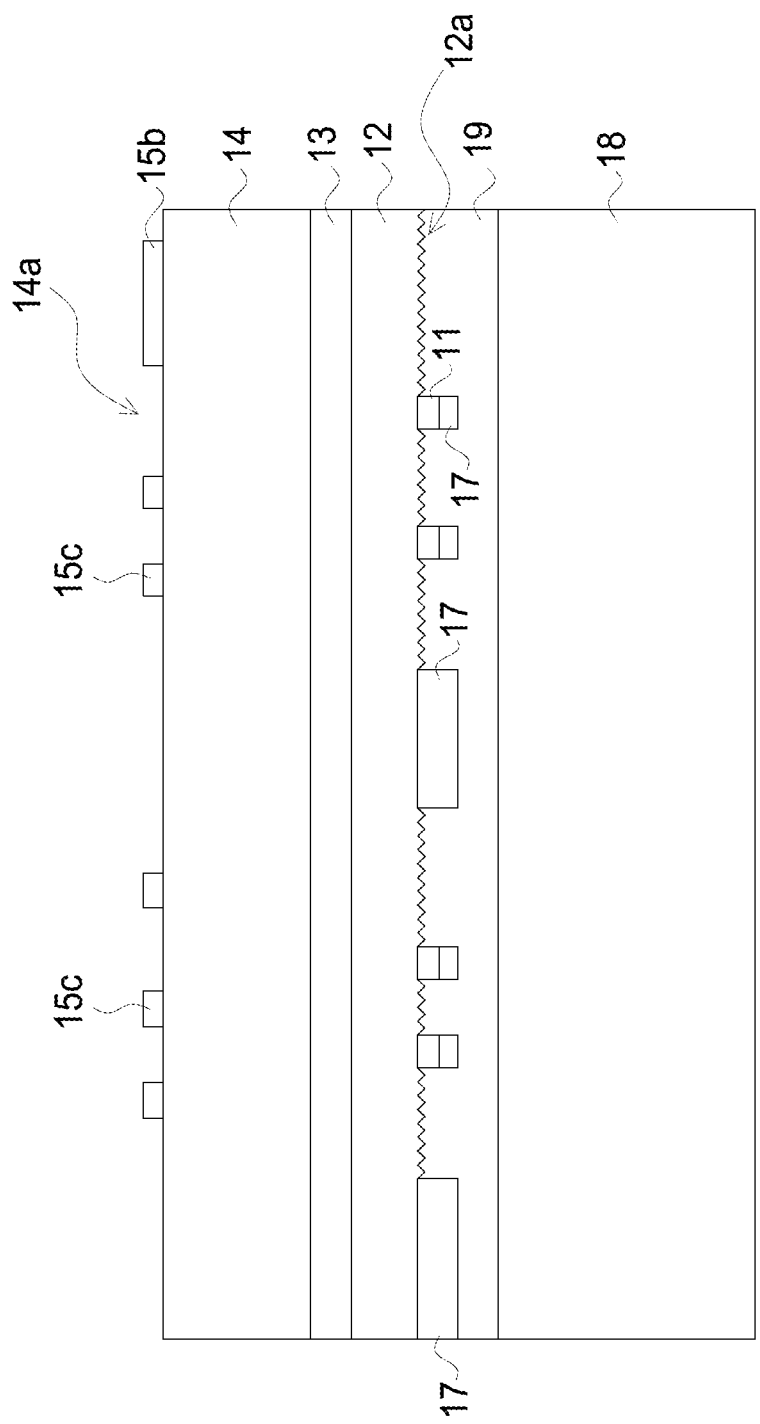
Figure 10:
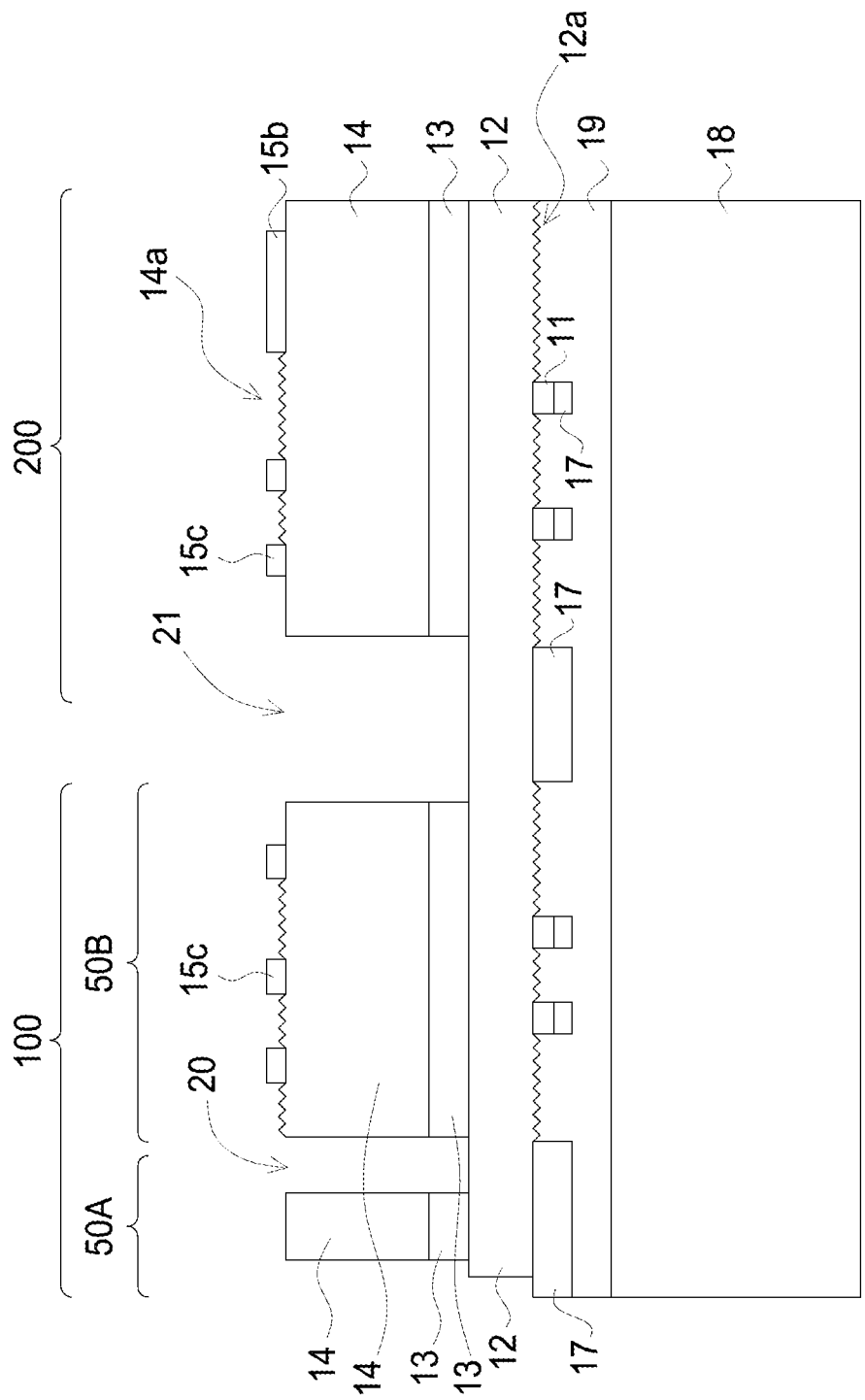
Figure 11:
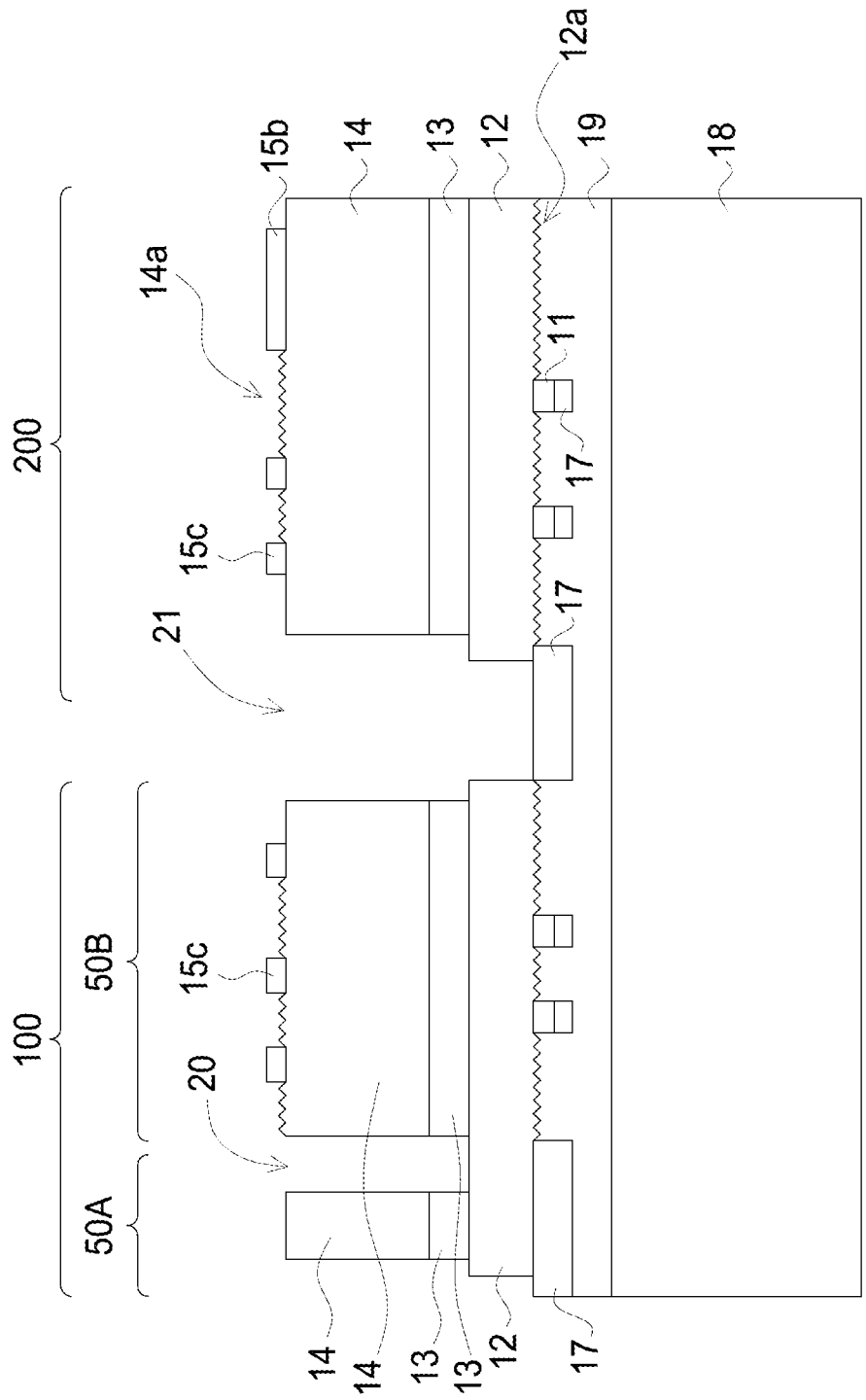
Figure 12:
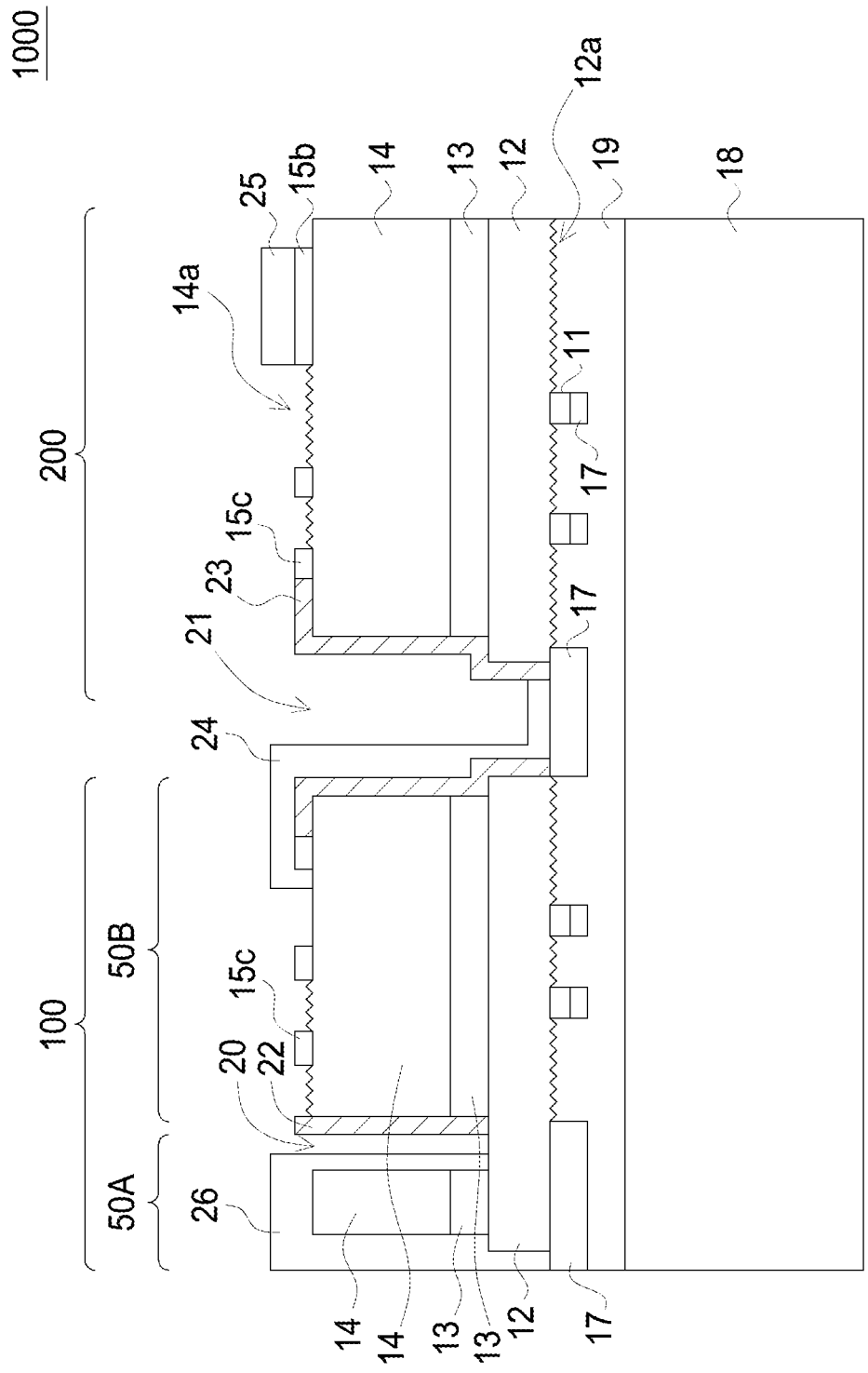

A rough surface is formed by wet etching the lower surface 12a of the first conductive semiconductor layer 12, as shown in FIG. 6. A permanent substrate 18 such as sapphire substrate is provided, and a bonding layer 19 is formed on the permanent substrate 18 to form a structure as shown in FIG. 7; or a bonding layer 19 is formed on the lower surface 12a of the first conductive type semiconductor layer 12 (not shown), and then the permanent substrate 18 is connected to the lower surface 12a of the first conductive type semiconductor layer 12 through the bonding layer 19. Referring to FIG. 8. the plurality of the dot structures of the first conductive type contact layer 11 and the electrical contact layer 17 are between the lower surface 12a of the first conductive type contact layer 12 and the bonding layer 19 after the structure shown in FIG. 6 is connected to the structure shown in FIG. 7. The temporary substrate 16 is removed to expose the second electrical electrode 15b, the plurality of second electrical extension electrodes 15c, and a part of a top surface 14a of the second conductive type semiconductor layer 14, as shown in FIG. 9. Referring to FIG. 10, dry etching is used to remove part of the second conductive type semiconductor layer 14 to the active layer 13 by inductively coupled plasma reactive ion etching to expose the partial surface of the first conductive type semiconductor layer 12, so as to form a first isolation path 20 and a second isolation path 21, wherein the first isolation path 20 separates the first light-emitting diode 100 into a first area 50A and a second area 50B, and a distance between the first area 50A and the second area 50B is not less than 25 μm. The second isolation path 21 is between the first light-emitting diode 100 and the second light-emitting diode 200, wherein the second light-emitting diode 200 comprises a semiconductor stack layer comprising a part of the second conductive type semiconductor layer 14, a part of the active layer 13 and the first conductive type semiconductor layer 12. The top surface 14a of the second conductive type semiconductor layer 14 is roughened by dry etching or wet etching as FIG. 10 shows. Referring to FIG. 11, a part of the first conductive type semiconductor layer 12 in the second isolation path 21 is removed by inductively coupled plasma reactive ion etching again. Different dry etching rates of the two dry etching processes render the sidewalls of the second conductive type semiconductor layer 14, the active layer 13, and the first conductive type semiconductor layer 12 that are in the second isolation path 21 a stepped structure.

An electrode isolation layer 22 is formed along the sidewall of the second area 50B in the first isolation path 20 by evaporation method, and a height of the electrode isolation layer 22 is larger than that of the sidewall of the second area 50B. An isolation structure 23 is formed continuously along the sidewall of the second area 50B in the second isolation path 21 and a part of the top surface of the second area 50B, and another isolation structure 23 is formed continuously along the sidewall of the second light-emitting diode 200 in the second isolation path 21 and a part of the top surface of the second light-emitting diode 200 by evaporation method. A material of the electrode isolation layer 22 and the isolation structure 23 can be dielectric materials such as silicon oxide, silicon nitride, aluminum oxide, zirconium oxide, or titanium oxide. An electrode contact layer 26 covering the sidewall and the top surface of the first area 50A is formed, and a material of the electrode contact layer 26 can be Ti—Au. The electrode contact layer 26 forms an electrical ohmic contact to the first conductive type semiconductor layer 12 by electrical contact layer 17 since the electrode contact layer 26 itself does not form ohmic contacts to the first conductive type semiconductor layer 12, the active layer 13, and the second conductive type semiconductor layer 14 of the first light-emitting diode 100. An electrical connecting structure 24 is formed on the top and the sidewall of the isolation structure 23 in the second area 50B and on the bottom of the second isolation path 21. The second conductive type semiconductor layer 14 of the first light-emitting diode 100 and the first conductive type semiconductor layer 12 of the second light-emitting diode 200 are electrically connected in series through the electrical connecting structure 24 and the electrical contact layer 17. A second electrical bonding pad 25 is then formed on the second electrical electrode 15b. Besides, the electrode contact layer 26 can be a first electrical bonding pad. Thus, when the electrical contact layer 26 and the second electrical bonding pad 25 are electrically connected to an external power source (not shown), an current supplied by the external power source flows from the electrode contact layer 26, through the first conductive type semiconductor layer 12, the active layer 13, and the second conductive type semiconductor layer 14 of the first light-emitting diode 100 due to the electrical contact layer 17, and the current also flows to the second light-emitting diode 200 by the electrical connecting structure 24. The electrode contact layer 26, the electrical connecting structure 24 and the second electrical bonding pad 25 can be formed at the same time by evaporation method, and the materials thereof can be the same.

A light-emitting diode array 1000 having two light-emitting diodes 100, 200 connected in series is formed after the above manufacturing process. The light-emitting diode 100 is separated into the first area 50A and the second area 50B by the first isolation path 20, wherein the first area 50A is covered by the electrode contact layer 26. The second electrical bonding pad 25 is on the partial top surface 14a of the second light-emitting diode 200. The height of the top surface of the electrode contact layer 26 can be the same as the height of the top surface of the second electrical bonding pad 25.

Figure 13:
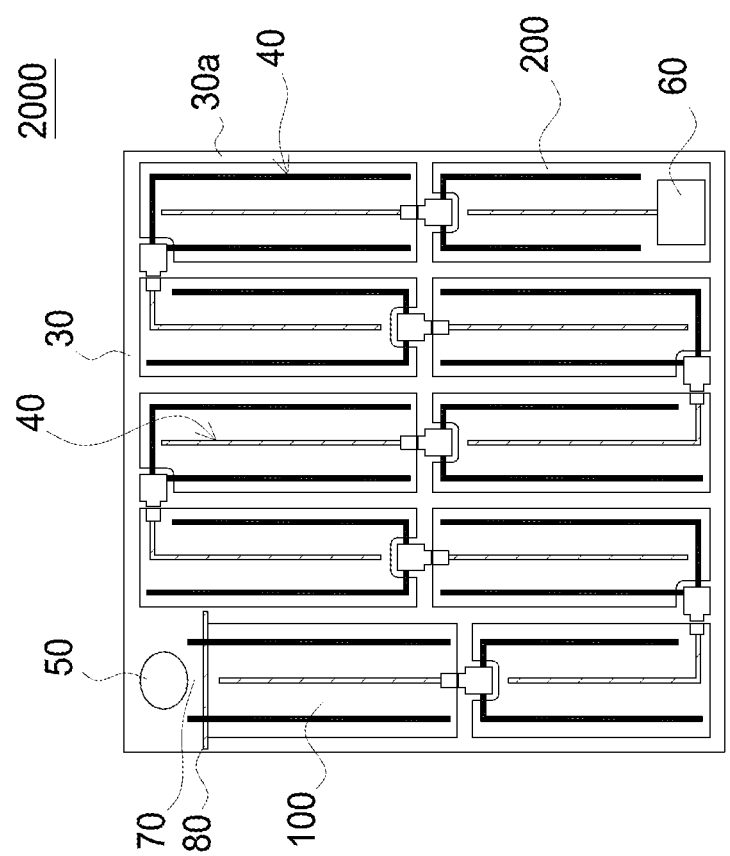
FIG. 13 illustrates a top view of a light-emitting diode array in accordance with the second embodiment of the present application.
Figure 14:
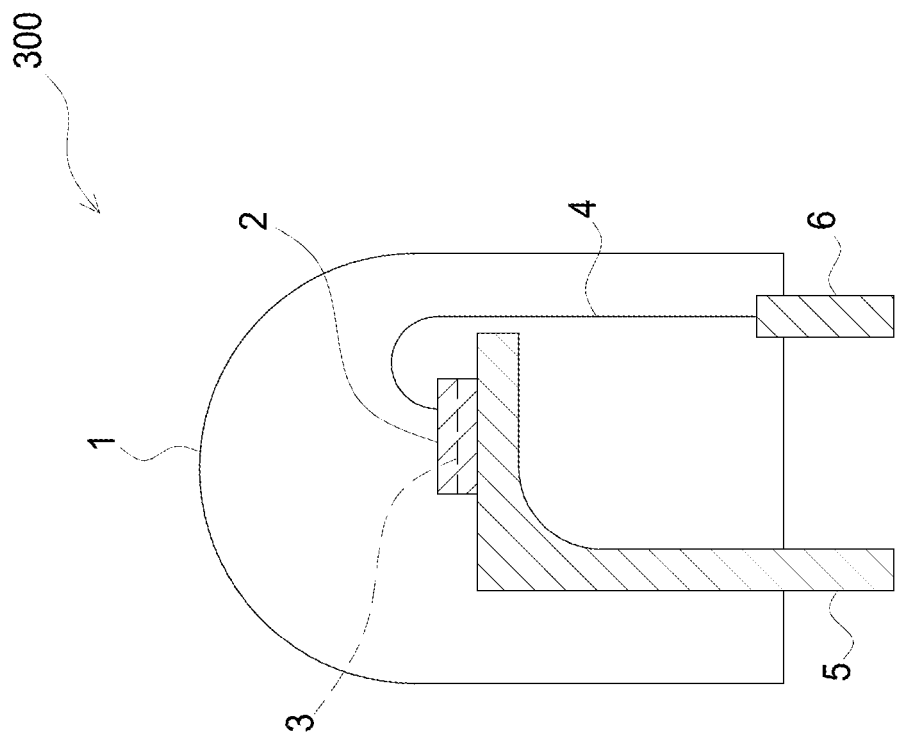
FIG. 14 illustrates a conventional LED package of a semiconductor lighting device.

FIG. 13 illustrates a top view of a light-emitting diode array 2000 in accordance with the second embodiment of the present application. The light-emitting diode array 2000 of the present embodiment comprises a plurality of first light-emitting diodes 100 and a plurality of second light-emitting diodes 200 that are connected in series, and the total number of light-emitting diodes is 10. Referring to FIG. 13, the light-emitting diode array 2000 comprises a substrate 30 having a first surface 30a; the 10 light-emitting diodes on the first surface 30a and including the first light-emitting diodes 100 and the second light-emitting diodes 200; a plurality of conductive lines 40 on the first surface 30a and electrically connected to the light-emitting diodes; two electrical bonding pads 50, 60 on the first surface 30a and electrically connected to an external power source (not shown); and an isolation path 70 between one of the electrical bonding pads (such as electrical bonding pad 50) and one of the light-emitting diodes, wherein a distance between the bonding pad 50 and the light-emitting diode 100 that are proximal to the isolation path 70 is not less than 25 μm. Furthermore, if the distance between the electrical bonding pad 50 and the light-emitting diode 100 is too small, semiconductor materials are prone to remaining on the sidewall of the light-emitting diode during the light-emitting diode etching process, thereby resulting in a current leakage problem. In order to alleviate the current leakage problem, an electrode isolation layer 80 is formed in the isolation path 70 and on the sidewall of the light-emitting diode. The substrate 30 is a carrier and comprises a conductive substrate, a non-conductive substrate, a transparent substrate or a non-transparent substrate.

The first conductive type semiconductor layer 12 and the second conductive type semiconductor layer 14 are different in electricity, polarity or dopant, or are different in semiconductor materials used for providing electrons or holes, wherein the semiconductor materials can be a single semiconductor material layer or multiple semiconductor material layers. The polarity can be chosen from any two of the group consisting of p-type, n-type and i-type. The active layer 13 where the electrical energy and the light energy can be converted or stimulatively converted is disposed between the first conductive type semiconductor layer 12 and the second conductive type semiconductor layer 14.

The light-emitting diode spectrum of the embodiments in the present application can be adjusted by changing the physical or chemical factors of the single semiconductor material layer or the multiple semiconductor material layers. The material can be AlGaInP series, AlGaInN series, or ZnO series. The structure of the active layer (not shown) can be single heterostructure (SH), double heterostructure (DH), double-side double heterostructure (DDH) or multi-quantum well (MQW), wherein the wavelength of the light emitted from the active layer (not shown) can be changed by adjusting the number of MQW pairs.

In one embodiment of the present application, a buffer layer (not shown) can be optionally disposed between the first conductive type contact layer 11 and the growth substrate 10. The buffer layer is between two material systems to make a transition between the material system of the substrate and the material system of the semiconductor layer. For the structure of the light-emitting diode, the buffer layer is used to reduce the lattice mismatch between two materials. On the other hand, the buffer layer comprises a single layer, multiple layers or a structure which comprises two materials or two separated structures. The material of the buffer layer can be organic material, inorganic material, metal or semiconductor material. The structure of the buffer layer can be a reflective layer, a thermally conductive layer, an electrically conductive layer, an ohmic contact layer, an anti-deformation layer, a stress release layer, a bonding layer, a stress adjustment layer, a wavelength conversion layer or a mechanically fixing structure. In one embodiment, the material of the buffer layer can be AlN, GaInP, InP, GaAs, AlAs or GaN, and the buffer layer can be formed by sputtering or atomic layer deposition (ALD).

A second conductive type contact layer (not shown) can be selectively formed on the second conductive type semiconductor layer 14. The second conductive type contact layer is disposed on the side of the second conductive type semiconductor layer 14 away from the active layer 13. More specifically, the second conductive type contact layer can be an optical layer, an electrical layer, or the combination thereof. The optical layer (not shown) can change the electromagnetic radiation or the light from or entering the active layer 13, that is, the optical layer can change at least one of the optical properties of the electromagnetic radiation or the light, wherein the optical properties comprises, but is not limited to frequency, wavelength, intensity, flux, efficiency, color temperature, rendering index, light field and angle of view. The electrical layer can change the value, density and distribution of the voltage, resistance, current and capacitance of any two opposite sides of the second conductive type contact layer. The material of the second conductivity type contact layer comprises oxide such as conductive oxide, transparent oxide and the oxide with a transparency not less than 50%, or comprises metal such as transparent metal and the metal with transparency not less than 50%, or comprises organic material, inorganic material, fluoresce material, phosphor material, ceramic, undoped semiconductor material or doped semiconductor material. In some aspects, the material of the second conductivity type contact layer can be indium tin oxide, cadmium tin oxide, antimony tin oxide, indium zinc oxide, aluminum zinc oxide, or zinc tin oxide. If the material of the second conductivity type contact layer is transparent metal, the thickness of the second conductivity type contact layer ranges from 0.005 µm to 0.6 µm.

It will be apparent to those having ordinary skill in the art that various modifications and variations can be made to the devices in accordance with the present application without departing from the scope or spirit of the disclosure. In view of the foregoing, it is intended that the present application covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

We claim:

1. A light-emitting diode array, comprising:
    a first light-emitting diode, comprising:
        a first area;
        a second area;
        a first isolation path between the first area and the second area;
        an electrode isolation layer formed in the first isolation path; and
        an electrode contact layer covering the first area;
    a second light-emitting diode, comprising:
        a semiconductor stack layer;
        an electrical bonding pad on the semiconductor stack layer; and
    a second isolation path between the first light-emitting diode and the second light-emitting diode; and
    an electrical connecting structure partially formed in the second isolation path and electrically connecting the first light-emitting diode with the second light-emitting diode;
    wherein each of the first area, the second area, and the semiconductor stack layer further comprises a first conductive type semiconductor layer, an active layer, and a second conductive type semiconductor layer.

2. The light-emitting diode array according to claim 1, further comprising a substrate below the first area, the second area, and the semiconductor stack layer.

3. The light-emitting diode array according to claim 2, further comprising a bonding layer between the substrate and the first area, between the substrate and the second area, and between the substrate and the semiconductor stack layer.

4. The light-emitting diode array according to claim 1, wherein the second isolation path further comprises an isolation structure.

5. The light-emitting diode array according to claim 3, further comprising an electrical contact layer between the bonding layer and the first area, between the bonding layer and the second area, and between the bonding layer and the semiconductor stack layer, and the electrical contact layer forming an ohmic contact between the electrode contact layer and the first conductive type semiconductor layer of the first area.

6. The light-emitting diode array according to claim 1, wherein the electrode contact layer is electrically connected to the first conductive type semiconductor layer of the first light-emitting diode and extends into the first isolation path, and the electrical bonding pad is electrically connected to the second conductive type semiconductor layer of the semiconductor stack layer.

7. The light-emitting diode array according to claim 1, wherein the electrode contact layer and the electrical bonding pad respectively comprise a top surface, wherein the top surfaces have the same height.

8. The light-emitting diode array according to claim 1, wherein a distance between the first area and the second area is not less than 25 μm.

9. The light-emitting diode array according to claim 1, wherein the second area and the semiconductor stack layer respectively comprise a top surface and each top surface is roughened.

10. The light-emitting diode array according to claim 1, wherein the first light-emitting diode and the second light-emitting diode are electrically connected in series or in parallel.

11. The light-emitting diode array according to claim 1, wherein the first isolation path separates the second conductive type semiconductor layer of the first area from the second conductive type semiconductor layer of the second area, separates the active layer of the first area from the active layer of the second area, and does not separate the first conductive type semiconductor layer of the first area from the first conductive type semiconductor layer of the second area.

12. The light-emitting diode array according to claim 1, wherein the second isolation path separates the second conductive type semiconductor layer of the second area from the second conductive type semiconductor layer of the second light-emitting diode, separates the active layer of the second area from the active layer of the second light-emitting diode and separates the first conductive type semiconductor layer of the second area from the first conductive type semiconductor layer of the second light-emitting diode.

13. The light-emitting diode array according to claim 1, wherein the electrode contact layer covers a sidewall of the second conductive type semiconductor layer of the first area and a sidewall of the active layer of the first area.

14. The light-emitting diode array according to claim 1, wherein the electrode contact layer covers an upper surface of the second conductive type semiconductor layer of the first area and extends into the first isolation path to cover a sidewall of the second conductive type semiconductor layer of the first area and a sidewall of the active layer of the first area.

15. The light-emitting diode array according to claim 5, wherein the electrical contact layer forms an ohmic contact between the electrical connecting structure and the first conductive type semiconductor layer of the semiconductor stack layer.

16. The light-emitting diode array according to claim 1, wherein the electrode isolation layer is formed along a sidewall of the second conductive type semiconductor layer of the second area and along a sidewall of the active layer of the second area.

17. The light-emitting diode array according to claim 1, wherein the first conductive type semiconductor layer of the first area physically connects the first conductive type semiconductor layer of the second area.

\* \* \* \* \*